(12) United States Patent
Jeung

(10) Patent No.: US 6,906,974 B2
(45) Date of Patent: Jun. 14, 2005

(54) SENSE AMPLIFIERS WITH OUTPUT BUFFERS AND MEMORY DEVICES INCORPORATING SAME

(75) Inventor: Seong-Ho Jeung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/644,338

(22) Filed: Aug. 20, 2003

(65) Prior Publication Data

US 2004/0047211 A1 Mar. 11, 2004

(30) Foreign Application Priority Data

Sep. 9, 2002 (KR) .................................. 10-2002-0054289

(51) Int. Cl.[7] .................................................. G11C 7/02
(52) U.S. Cl. .............. 365/207; 365/189.09; 365/189.05
(58) Field of Search ........................... 365/207, 189.09, 365/189.05, 196, 204, 230.08, 189.04

(56) References Cited

U.S. PATENT DOCUMENTS

| | | | | |
|---|---|---|---|---|
| 4,507,759 A | * | 3/1985 | Yasui et al. ................. | 365/154 |
| 4,805,143 A | * | 2/1989 | Matsumoto et al. ........ | 365/104 |
| 5,757,809 A | * | 5/1998 | Kiso et al. .................. | 714/718 |
| 6,229,739 B1 | * | 5/2001 | Poplevine et al. ..... | 365/189.09 |

* cited by examiner

Primary Examiner—Thong Q. Le
(74) Attorney, Agent, or Firm—Myers Bigel Sibley & Sajovec

(57) ABSTRACT

A memory device includes a memory cell array including a plurality of memory cells and cell select circuitry configured to selectively connect the plurality of memory cells to a data line, e.g., a common output node of a column selecting gate circuit. The device further includes a bias circuit operative to charge the data line to a bias voltage responsive to a bias enable signal, and a sense amplifier circuit having an input coupled to the data line and including an output buffer. The sense amplifier circuit is operative to drive the output buffer according to a voltage on the data line responsive to a sense enable signal to thereby generate a sense amplifier output signal indicative of a state of a memory cell connected to the data line.

31 Claims, 5 Drawing Sheets

SENSE AMPLIFIERS WITH OUTPUT BUFFERS AND MEMORY DEVICES INCORPORATING SAME

RELATED APPLICATION

This U.S. nonprovisional patent application claims priority under 35 U.S.C. § 119 to Korean Patent Application 2002-54289 filed on Sep. 9, 2002, the entire contents of which is hereby incorporated by reference.

BACKGROUND OF THE INVENTION

The present invention relates to semiconductor memory devices, and more particularly, sense amplifiers for memory devices.

As a power supply voltage of a semiconductor memory device is lowered, a conventional sense amplifier may not operate stably in such semiconductor memory devices operating at a lower power supply voltage such as 1V.

FIG. 1 schematically illustrates a conventional semiconductor memory device capable of inputting and outputting one bit of data at a time. Referring to FIG. 1, a conventional semiconductor memory device comprises a memory cell array 10 having flash memory cells MC, a row decoder 12, a pre-discharge circuit 14, a data input and output gate circuit 16, a column decoder 18 and a sense amplifier 20. The operation of each block of the semiconductor memory device shown in FIG. 1 is described below.

The memory cell array 10 comprises flash memory cells MC connected between corresponding word lines WL1, WL2, . . . , WLi and corresponding bit lines BL1, BL2, . . . , BLj. The memory cell array 10 stores data "1" in the flash memory cells MC in an erase operation, and stores data "0" in a program operation. The row decoder 12 decodes a row address RA and generates a selection signal for selecting one of the word lines WL1, WL2, . . . , WLi.

The pre-discharge circuit 14 is connected between the respective bit lines BL1, BL2, . . . , BLj and a ground voltage, and comprises NMOS transistors N1 with respective gates to which a pre-discharge control signal DISCH is applied. The pre-discharge circuit 14 pre-discharges the bit lines BL1, BL2, . . . , BLj to a ground voltage in response to the pre-discharge control signal DISCH.

The data input and output gate circuit 16 is connected between the respective bit lines BL1, BL2, . . . , BLj and a data line, shown here as a common node COM, and comprises NMOS transistors N2 with respective gates to which corresponding column selection signals Y1, Y2, . . . , Yj are applied. The NMOS transistors N2 are turned on in response to the corresponding column selection signals Y1, Y2, . . . , Yj and transmit data between the corresponding bit lines BL1, BL2, . . . , BLj and the common node COM. The column decoder 18 decodes a column address CA and generates the corresponding respective column selection signals Y1, Y2, . . . , Yj. The sense amplifier 20 detects a current change of the common node COM in response to a bias control signal BIAS in a read operation, and generates a sense output signal Sout.

FIG. 2 illustrates a detailed circuit diagram of the sense amplifier shown in FIG. 1. Referring to FIG. 2, a sense amplifier in accordance with the conventional art comprises a PMOS transistor P1 and an NMOS transistor N3. The PMOS transistor P1 comprises a source to which a power supply voltage VDD is applied and gate and drain terminals connected to a sense output signal Sout generating terminal. The NMOS transistor N3 comprises a drain connected to the sense output signal Sout generating terminal, a gate to which the bias control signal BIAS is applied and a source connected to the common node COM.

In FIG. 2, the NMOS transistor N3 is larger than the PMOS transistor P1 in transconductance. Voltage gain of the sense amplifier is the transconductance ratio of the PMOS transistor P1 and the NMOS transistor N3. The operation of the circuit shown in FIG. 2 is described below.

During the pre-discharge operation, if the pre-discharge control signal DISCH having a power supply voltage is generated, NMOS transistors N2 are turned on in response to the pre-discharge control signal DISCH and the bit lines BL1, BL2, . . . , BLj become a ground voltage. At this time, because the bias control signal BIAS is at the ground voltage, the NMOS transistor N3 is turned off and the sense output signal Sout has a voltage, VDD−Vtp, wherein the Vtp refers a threshold voltage of the PMOS transistor P1.

When a read command is applied, the bias control signal BIAS is driven to the power supply voltage and the pre-discharge control signal DISCH transitions to a ground voltage level. Accordingly, the NMOS transistors N2 are turned off and the NMOS transistor N3 is turned on. Thus, a current flows through the NMOS transistor N3 and a voltage level of the common node COM increases. As the voltage of the common node COM increases, if a voltage difference between the gate and source of the NMOS transistor N3 is less than a threshold voltage of the NMOS transistor N3, the NMOS transistor N3 is turned off, which causes the voltage level of the common node COM to approach the bias voltage.

Upon the occurrence of such a condition, if the word line WL1 selection signal and the column selection signal Y1 are at the power supply voltage, the flash memory cell MC connected between the word line WL1 and the bit line BL1 is selected. If the flash memory cell MC stores a data "0", the NMOS transistor N1 and the flash memory cell MC are turned on and a current flows from the common node COM to the flash memory cell MC, which lowers the voltage level of the common node COM and turns on the NMOS transistor N3. As a result, current flows through the NMOS transistor N3 and the voltage level of the sense output signal Sout generating terminal decreases. The voltage of the sense output signal Sout decreases by an amount of the voltage gain of the sense amplifier 20 times the reduced voltage of the common node COM.

If the selected flash memory cell MC stores a data "1", the flash memory cell is turned off and current does not flow from the common node COM through the flash memory cell MC. Accordingly, the NMOS transistor N4 is turned off and the sense output signal Sout remains at a voltage level of VDD−Vtp.

The minimum power supply voltage for operation of the sense amplifier shown in FIG. 2 may be determined as follows. During a read operation, a minimum voltage of the data line is 0.4V and a minimum voltage difference between the drain and source of the NMOS transistor N3 is 0.2V, a threshold voltage of the PMOS transistor P1 is 0.4V, and an effective driving voltage of the PMOS transistor P1 is 0.2V, when the flash memory cell MC stores data "0". Accordingly, the minimum operating power supply voltage of the sense amplifier 20 is obtained by adding the above voltage values, which equals around 1.2V.

That is, the conventional sense amplifier shown in FIG. 2 operates normally as long as no less than 1.2V of the power supply voltage is applied thereto. However, because a voltage drop of 0.4V occurs due to the PMOS transistor P1 acting as a diode, a power supply voltage of less than 1.2V may cause the sense amplifier to malfunction. However, considering process parameter variations in fabricating the semiconductor memory device with the sense amplifier and variation in operating conditions, such as a temperature, the minimum power supply voltage at which the sense amplifier operates normally and stably typically is far greater than 1.2V. In conclusion, the conventional sense amplifier shown in FIG. 2 may not operate normally and stably at a low power supply voltage, such as 1.0V or less.

SUMMARY OF THE INVENTION

According to some embodiments of the present invention, a memory device comprises a memory cell array comprising a plurality of memory cells and cell select circuitry configured to selectively connect the plurality of memory cells to a data line, e.g., a common output node of a column selecting gate circuit. The device further comprises a bias circuit operative to charge the data line to a bias voltage responsive to a bias enable signal, and a sense amplifier circuit having an input coupled to the data line and including an output buffer. The sense amplifier circuit is operative to drive the output buffer according to a voltage on the data line responsive to a sense enable signal to thereby generate a sense amplifier output signal indicative of a state of a memory cell connected to the data line.

In some embodiments of the present invention, the bias circuit comprises a buffer having an input coupled to the data line and operative to be enabled and disabled responsive to the bias enable signal. The bias circuit further includes a first transistor having a drain coupled to the input of the buffer, a source coupled to a power supply node and a gate coupled to an output of the buffer, and a second transistor having a source coupled to the power supply node, a drain coupled to the output of the buffer, and a gate coupled to the bias enable signal. The first and second transistors may comprise respective PMOS transistors.

In further embodiments of the present invention, the sense amplifier circuit comprises first and second complementary transistors coupled in series between the data line and the power supply node and coupled to an input of the output buffer at a junction of the first and second transistors. A sense enable circuit is coupled to the data line and to a gate of the first transistor, and is operative to drive the gate of the first transistor responsive to the sense amplifier enable signal. In some embodiments, the sense enable circuit comprises an inverter having an input coupled to the data line and an output coupled to the gate of the first transistor, the inverter operative to be enabled and disabled responsive to the sense amplifier, and a third transistor having a drain coupled to an output of the inverter, a source coupled to a ground node, and a gate that receives the sense amplifier enable signal. In further embodiments, the data line is coupled to an input of the buffer, the output buffer comprises an inverter operative to be enabled and disabled responsive to the sense amplifier enable signal, and the sense amplifier circuit comprises a transistor coupled between the data line and the power supply node and having a gate that receives the sense amplifier enable signal.

According to some embodiments of the present invention, a memory device and a sense amplifier thereof capable of operating normally and stably at a low voltage not greater than 1.0V may be provided. In some embodiments, a semiconductor memory device comprising a) a memory cell array with a plurality of word lines, a plurality of bit lines and a plurality of memory cells, b) a pre-discharge circuit for pre-discharging the bit lines during a pre-discharge operation, c) a data input/output gate circuit for transmitting data between the plurality of bit lines and a plurality of data lines during a read operation, and d) a sense amplifier including a bias circuit for biasing the data lines to a bias voltage level in response to a bias control signal during the read operation, and a sense amplifier circuit for detecting and amplifying voltage level changes of the data lines, and generating a sense output signal in response to a sense amplifier enable signal during the read operation.

In accordance with some embodiments of the present invention, there is provided a sense amplifier for use a semiconductor memory device comprising a bias circuit for biasing a sense input signal terminal to a bias voltage level in response to a bias control signal, and a sense amplifier circuit for generating a sense output signal by detecting and amplifying bias voltage level changes of the sense input signal terminal in response to a sense amplifier enable signal.

The bias circuit may comprise a first transistor connected between a power supply voltage and the data line, a second transistor operative to be turned on in response to the bias control signal to switch off the first transistor during the pre-discharge operation, and to be turned on when the sense amplifier enable signal is enabled during the read operation, and a first buffer that is enabled in response to the bias control signal for buffering a voltage of the data line during the read operation, and that is disabled when the sense amplifier enable signal is enabled during the read operation.

The sense amplifier circuit may comprise a third transistor connected between a power supply voltage and a first node for supplying a current to the first node, an inverter that is operative to be enabled in response to the sense amplifier enable signal for inverting a voltage level of the sense input signal terminal and transmitting the inverted voltage level to a second node, a fourth transistor connected between the second node and a ground voltage and operative to be turned off in response to the sense amplifier enable signal, a fifth transistor connected between the first node and the sense input signal terminal and operative to be turned on in response to a signal of the second node for letting a current flow from the first node to the sense input signal terminal, and a second buffer operative to be enabled in response to the sense amplifier enable signal for buffering a signal of the first node and generating the sense output signal.

The sense amplifier may comprise a third transistor connected between a power supply voltage and a first node for supplying a current to the first node, a fourth transistor connected between the first node and the sense input signal terminal for supplying a current to the sense input signal terminal by being turned on in response to the sense amplifier enable signal, and a second buffer for buffering a voltage signal of the sense input signal terminal and generating the sense output signal by being enabled in response to the sense amplifier enable signal.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when elements are referred to as being coupled to one another, this coupling may be direct or via one or more intervening elements.

Figure 3:
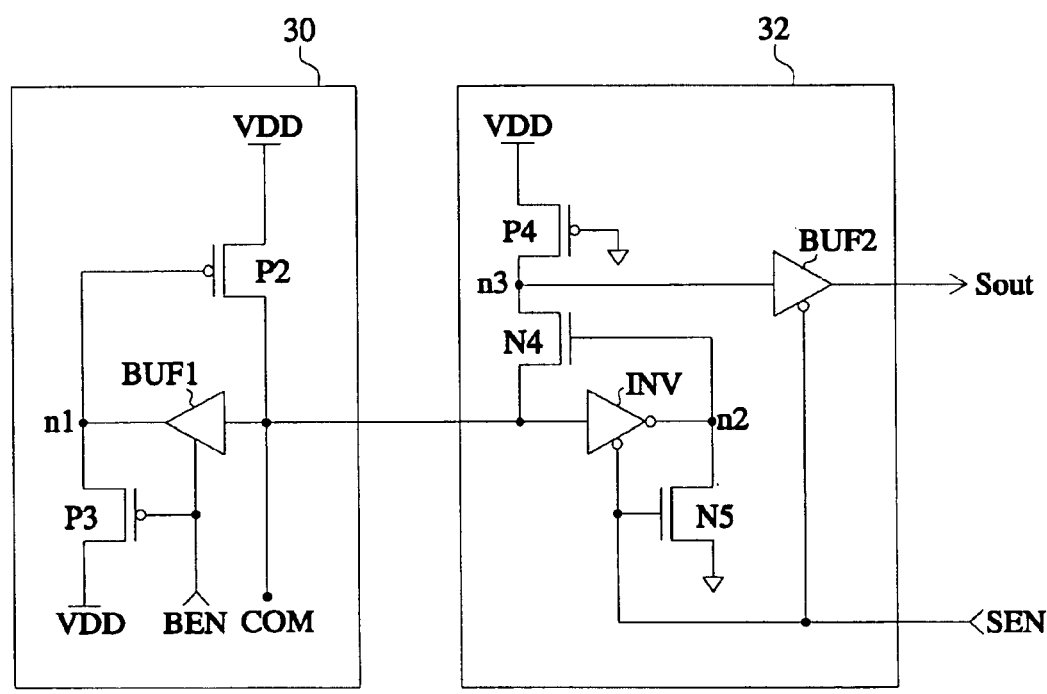
FIG. 3 is a circuit diagram of a sense amplifier in accordance with some embodiments of the present invention.

FIG. 3 illustrates a sense amplifier in accordance with some embodiments of the present invention. Referring to FIG. 3, a sense amplifier in accordance with some embodiments of the present invention comprises a bias circuit 30 including PMOS transistors P2 and P3 and a buffer BUF1, and an amplifier circuit 32 including a PMOS transistor P4, NMOS transistors N4 and N5, an inverter INV and a buffer BUF2.

The PMOS transistor P2 has a source to which a power supply voltage VDD is applied, a drain connected to a data line, here shown as a common node COM, and a gate connected to a node n1. It will be appreciated that the data line may be configured to be coupled to one or more memory cells using, for example, the cell select circuitry shown in FIG. 1. The PMOS transistor P3 has a drain connected to the node n1, a source to which a power supply voltage is applied, and a gate to which a bias control signal BEN is applied. The buffer BUF1 has an input terminal connected to the common node COM, an output terminal connected to the node n1 and an enable terminal to which a bias control signal BEN is applied.

The PMOS transistor P4 has a source to which a power supply voltage VDD is applied, a gate connected to a ground voltage, and a drain connected to a node n3. The NMOS transistor N4 has a drain connected to the drain of the PMOS transistor P4, a gate connected to a node n2 and a source connected to the common node COM. The inverter INV has an input terminal connected to the common node COM, an output terminal connected to the node n2 and an enable terminal to which a sense amplifier enable signal SEN is applied. The NMOS transistor N5 has a drain connected to the node n2, a gate to which the sense amplifier enable signal SEN is applied, and a source connected to a ground voltage. The buffer BUF2 has an input terminal connected to the node n3, an output terminal connected to a sense output signal Sout generating terminal, and an enable terminal to which the sense amplifier enable signal SEN is applied.

Figure 4:
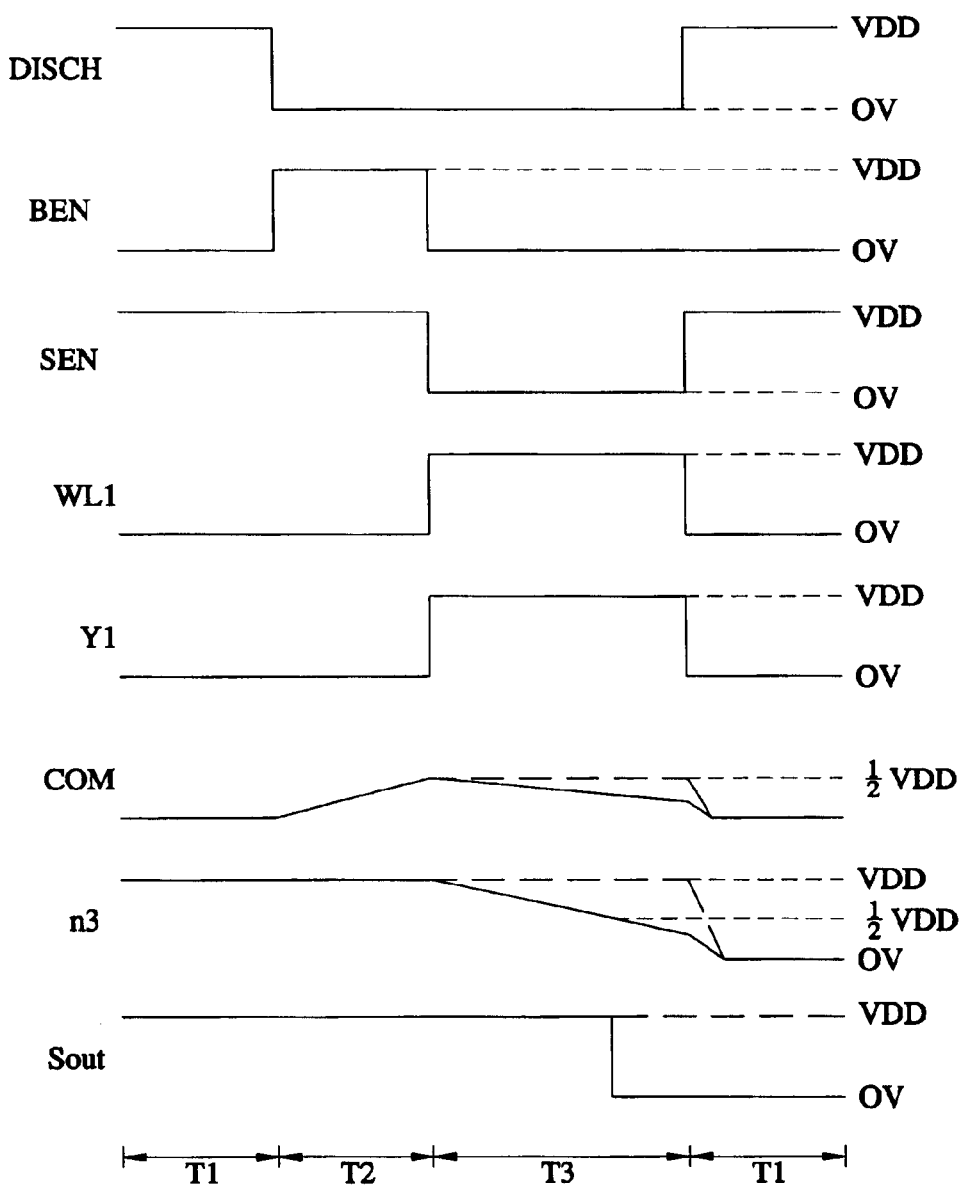
FIG. 4 is a timing diagram showing exemplary operations of the sense amplifier shown in FIG. 3.

FIG. 4 illustrates a timing diagram illustrating exemplary operations of the circuit shown in FIG. 3. Referring to FIG. 4, the pre-discharge control signal DISCH is maintained at a ground voltage level during the read operation and the bias control signal BEN is a pulse signal that rises to a logic "high" level in response to a falling edge of the pre-discharge control signal DISCH and that falls to a logic "low" level after a predetermined time period. The sense amplifier enable signal SEN is a pulse signal that falls to a logic "low" level in response to a falling edge of the bias control signal BEN and rises to a rising edge of the pre-discharge control signal DISCH. A word line WL1 selection signal is a pulse signal that rises to a logic "high" level in response to a falling edge of the bias control signal BEN and that falls to a logic "low" level in response to a rising edge of the pre-discharge control signal DISCH.

Figure 1:
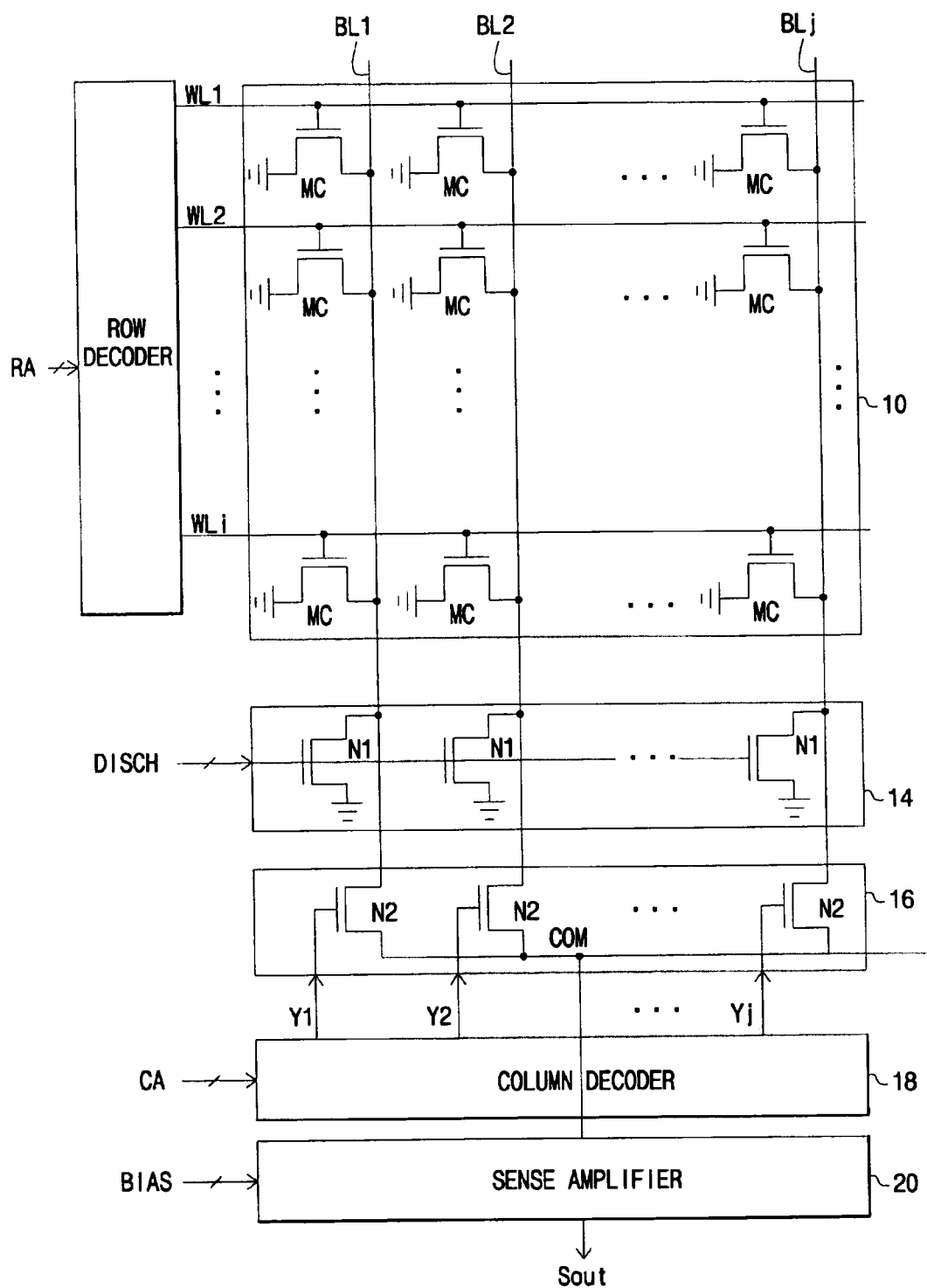
FIG. 1 is a block diagram of a semiconductor device in accordance with the conventional art.
Figure 2:
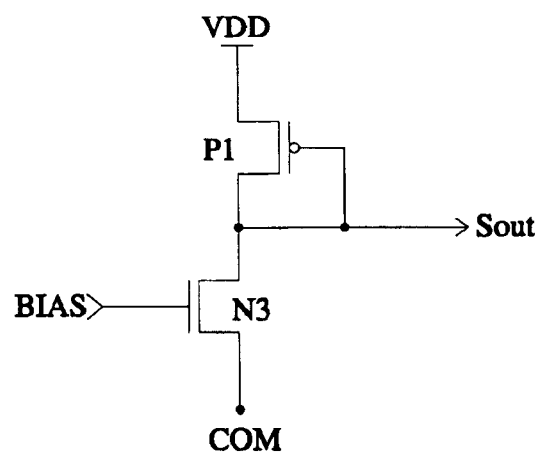
FIG. 2 is a circuit diagram of a sense amplifier in FIG. 1 in accordance with the conventional art.

During the time period T1 of the pre-discharge operation, if the pre-discharge control signal DISCH is at the power supply voltage, the NMOS transistors N2 shown in FIG. 1 are turned on in response to the pre-discharge control signal DISCH and the bit lines BL1, BL2, ..., BLj go to a ground voltage. In response to the bias voltage control signal BEN having a ground voltage, the buffer BUF1 is switched off and the PMOS transistor P3 is turned on, so that the node n1 goes to the power supply voltage level, which turns off the PMOS transistor P2. Further, in response to the sense amplifier enable signal SEN being at the power supply voltage, the inverter INV and the buffer BUF2 are disabled. At this time, the sense output signal Sout is driven to a power supply voltage. Further, because the PMOS transistor P4 and the NMOS transistor N4 are turned off, the node n3 goes to the power supply voltage VDD.

During the bias time period T2 in the read operation, the bias control signal BIAS is driven to the power supply voltage and the pre-discharge control signal DISCH transitions to a ground voltage level. Accordingly, the PMOS transistor P3 is turned off, and the buffer BUF1 buffers the signal of the common node COM, which is at the ground voltage, and drives the node n1 to the ground voltage. Then, the PMOS transistor P2 is turned on, and the voltage level of the common node COM increases. When a voltage level of the common node COM is higher than a threshold voltage VDD/2 of the buffer BUF1, the buffer BUF1 drives the node n1 to the power supply voltage. As a result, the PMOS transistor P2 is turned off.

In such a way described above, the common node COM is biased to about a voltage VDD/2. At this time, the buffer BUF2 is disabled in response to the sense amplifier enable signal SEN being at the power supply voltage and the sense output signal Sout maintains the power supply voltage level which is set during the time period T1. The node n3 is maintained at the power supply voltage level because the PMOS transistor P3 is turned on and the NMOS transistor N4 is turned off.

During a sensing time period T3 in the read operation, a flash memory cell MC connected between the word line WL1 and the bit line BL1 is selected in response to the word line WL and the column selection signal. At this time, if the selected flash memory cell MC stores a data "0", the NMOS transistor N2 and the flash memory cell MC shown in FIG. 1 are turned on and a current flows from the common node COM through the flash memory cell MC. Accordingly, a voltage level of the common node is lowered. In response to the bias control signal BEN and the sense amplifier enable signal SEN having the ground voltage, the PMOS transistor P3 is turned on, the NMOS transistor N5 is turned off, the buffer BUF1 is disabled, and the inverter INV and the buffer BUF2 are enabled.

As the PMOS transistor P3 is turned on, the node n1 approaches the ground voltage. As a result, the PMOS transistor P2 is turned on and a current is supplied to the common node COM. However, because a current continuously flows from the common node COM through the flash memory cell MC, a voltage level of the common node COM is gradually lowered. The inverter INV drives the node N2 to the ground voltage if the voltage level of the common node COM is lowered to about VDD/2, a threshold voltage of the inverter INV. Then, the NMOS transistor N4 is turned on and a current flows from the node n3 to the common node COM. Accordingly, a voltage level of the node n3 decreases.

At this time, because a transconductance of the PMOS transistor P4 is small and a transconductance of the NMOS transistor N4 is great, the voltage level of the node n3 is gradually lowered. The buffer BUF2 drives to sense output signal Sout to the ground voltage when voltage level of the node n2 reaches to about VDD/2, a threshold voltage of the buffer BUF2. In the timing diagram of FIG. 4, voltages of the common node COM, the node n3 and the sense output signal Sout for a memory cell storing a logic "0" are depicted with solid lines.

If the selected flash memory cell stores a data "1", because the flash memory cell MC is turned off, a current does not flow from the common node through the flash memory cell MC. Accordingly, the voltage level of the common node COM does not change, and the inverter INV drives the node n2 to the ground voltage and the NMOS transistor N4 is turned off. The node n3 is maintained at the power supply level and the buffer BUF2 drives the sense output signal Sout to the power supply voltage. In the timing diagram of FIG. 4, voltage changes of the common node COM, the node N3 and the sense output signal Sout in the case that the flash memory cell MC stores data "1" are depicted with dashed lines.

The minimum operating voltage for operation of the sense amplifier shown in FIG. 3 can be determined as follows. During the read operation, the minimum voltage of the data line is about 0.4V, a threshold voltage of the NMOS transistor N4 is at least about 0.4V, and the threshold voltage variation caused by the body effect is at least about 0.2V. The total sum of the voltages is about 1.0V. Accordingly, the sense amplifier shown in FIG. 3 can operate at about a 1.0V power supply voltage. However, process parameter changes and temperature changes may be considered. Accordingly, it may be desirable that the minimum power supply voltage for operation of the sense amplifier be lower than 1.0V.

Figure 5:
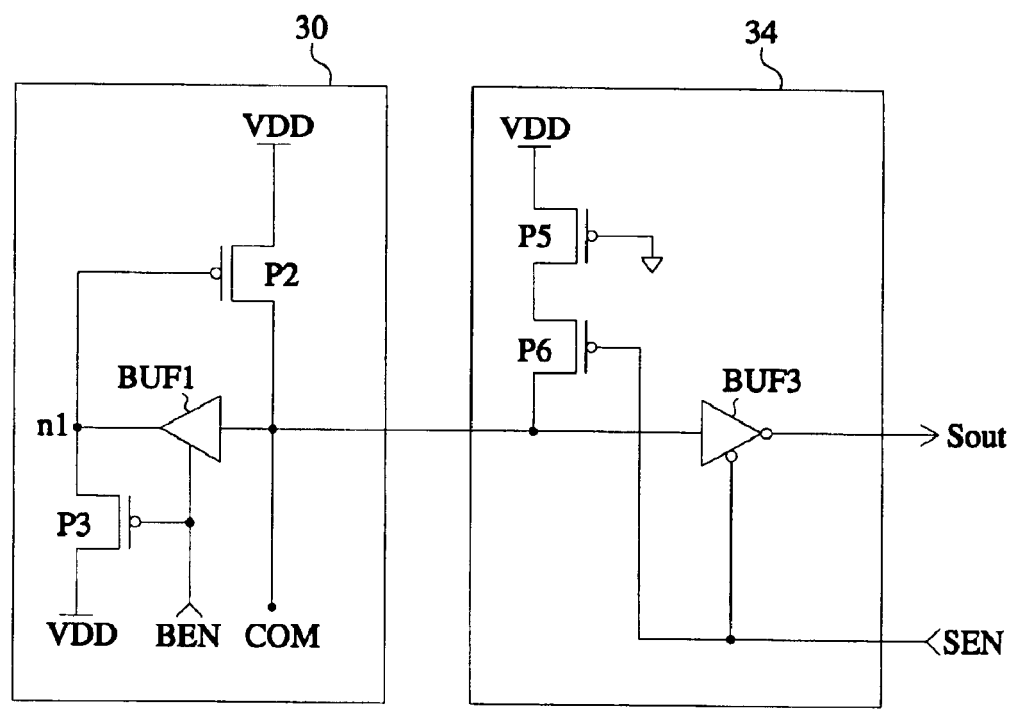
FIG. 5 is a circuit diagram of a sense amplifier in accordance with further embodiments of the present invention.

FIG. 5 illustrates a sense amplifier in accordance with further embodiments of the present invention. Referring to FIG. 5, the sense amplifier comprises a bias circuit 30 including PMOS transistors P2 and P3 and a buffer BUF1, and an amplifier circuit 34 including PMOS transistors P5 and P6 and a buffer BUF3. The bias circuit 30 shown in FIG. 5 is the same as the bias circuit 30 of the sense amplifier shown in FIG. 3. Accordingly, further discussion of the bias circuit 30 is omitted.

The amplifier circuit 34 comprises a PMOS transistor P5 having a source to which a power supply voltage is applied and a gate to which a ground voltage is applied. The amplifier circuit 34 further includes a PMOS transistor P6 with a source connected to a drain of the PMOS transistor P5, a gate connected to a sense amplifier enable signal SEN generating terminal and a drain connected to the common node COM. A buffer BUF3 has an input terminal connected to the common node COM, an output terminal connected to a sense output signal Sout generating terminal and an enable terminal to which a sense enable signal SEN is applied.

Figure 6:
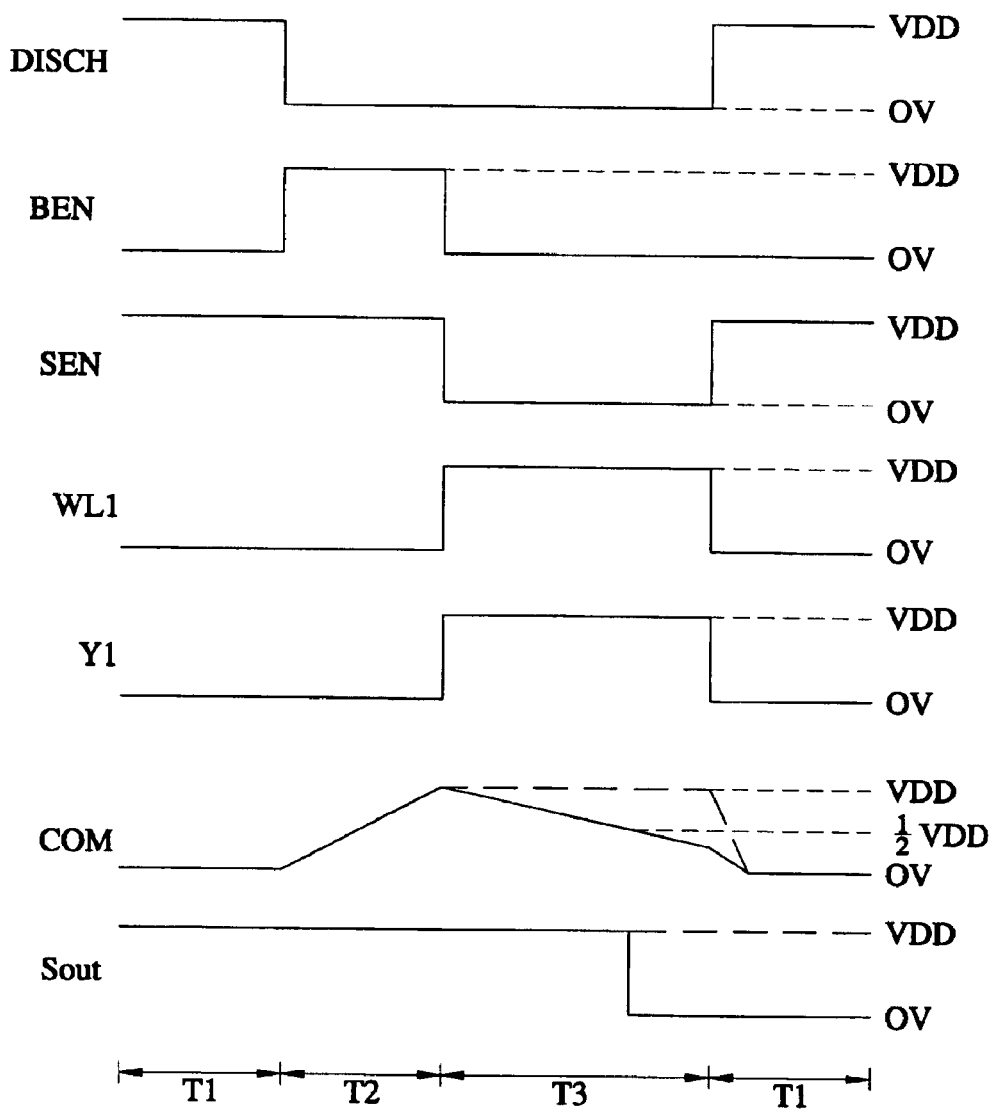
FIG. 6 is a timing diagram showing exemplary operations of the sense amplifier shown in FIG. 5.

FIG. 6 illustrates a timing diagram of exemplary operations of the circuit shown in FIG. 5. In FIG. 6, a bias control signal BEN, a sense amplifier enable signal SEN and word line WL selection signals are generated in the same way as shown in FIG. 4. The bias circuit 30 in FIG. 5 operates in the same way as the bias circuit shown in FIG. 3. During a time period T1 of the pre-discharge operation, the common node COM is driven to a ground voltage by action of the bias circuit 30. When the sense amplifier enable signal SEN is driven to the power supply voltage, the PMOS transistor P6 is turned off and the buffer BUF3 is disabled. Accordingly, the sense output signal Sout is maintained at the power supply voltage level (as initially set).

During a bias time period T2 in the read operation, the common node COM is driven to a power supply voltage level by the bias circuit 30. During a sensing time period T3 in the read operation, if the flash memory cell MC stores a data "0" (solid lines) and the flash memory cell MC is turned on, current flows through the common node COM to the flash memory cell MC, so that voltage level of the common node COM is lowered. When the sense amplifier enable signal SEN is driven to the ground voltage level, the PMOS transistor P6 is turned on and the buffer BUF3 is enabled. Accordingly, if the voltage level of the common node reaches to VDD/2, a threshold voltage of the buffer BUF3, the buffer BUF3 drives the sense output signal Sout to the ground voltage level.

However, if the flash memory cell MC stores a data "1" and the flash memory cell MC is turned off (dashed lines), a current does not flow from the common node COM to the flash memory cell MC. Accordingly, the voltage level of the common node is not lowered and the buffer BUF3 drives the sense output signal Sout to the power supply voltage. A leakage current which flows through the flash memory cells connected to a selected bit line from the common node is compensated, as the PMOS transistors P5 and P6 are designed to have very small size and the PMOS transistor P6 is turned on during the time period T3.

For a sense amplifier operating in such a way as described above with reference to FIG. 5 and FIG. 6, the minimum operating power supply voltage for operation of the sense amplifier will be about 0.4V, which is a minimum voltage of the data line during the read operation. Voltage drops do not occur across the PMOS transistors P5 and P6. The sense amplifier shown in FIG. 5 may operate stably at a low power supply voltage of 1.0V because the minimum operating voltage thereof is 0.4V, even if process parameter variations that occur during fabrication are considered.

The above-described embodiments of the present invention relate a semiconductor memory device with flash memory cells and sense amplifiers, but it will be appreciated that the present invention may also be applied to a semiconductor memory device with read only memory cells and sense amplifiers.

In the drawings and specification, there have been disclosed typical embodiments of the invention and, although specific terms are employed, they are used in a generic and descriptive sense only and not for purposes of limitation, the scope of the invention being set forth in the following claims. Although the invention has been described with reference to particular embodiments, it will be apparent to one of ordinary skill in the art that modifications of the described embodiments may be made without departing from the spirit and scope of the invention.

What is claimed is:

1. A memory device comprising:
   a memory cell array comprising a plurality of memory cells and cell select circuitry configured to selectively connect the plurality of memory cells to a data line;
   a bias circuit operative to charge the data line to a bias voltage responsive to a bias enable signal; and
   a sense amplifier circuit having an input coupled to the data line and including an output buffer, configured to be enabled and disabled responsive to a sense amplifier enable signal, the sense amplifier circuit operative to drive the output buffer according to a voltage on the data line responsive to the sense enable signal to thereby generate a sense amplifier output signal indicative of a state of a memory cell connected to the data line.

2. A memory device comprising:

a memory cell array comprising a plurality of memory cell and cell select circuitry configured to selectively connect the plurality of memory cells to a data line;

a biased circuit operative to charge the data line to a bias voltage responsive to a bias enable signal, wherein the bias circuit comprises:
- a buffer having an input coupled to the data line and operative to be enabled and disabled responsive to the bias enable signal;
- a first transistor having a drain coupled to the input of the buffer, a source coupled to a power supply node and a gate coupled to an output of the buffer; and
- a second transistor having a source coupled to the power supply node, a drain coupled to the output of the buffer, and a gate coupled to the bias enable signal; and a sense amplifier circuit having an input coupled to the data line and including an output buffer, the sense amplifier circuit operative to drive the output buffer according to a voltage on the data line responsive to a sense enable signal to thereby generate a sense amplifier output signal indicative of a state of a memory cell connected to the data line.

3. A device according to claim 2, wherein the first and second transistors comprise respective PMOS transistors.

4. A device according to claim 1, wherein the sense amplifier circuit comprises:

first and second complementary transistors coupled in series between the data line and the power supply node and coupled to an input of the output buffer at a junction of the first and second transistors; and a sense enable circuit coupled to the data line and to a gate of the first transistor, the sense enable circuit operative to drive the gate of the first transistor responsive to the sense amplifier enable signal.

5. A device according to claim 4, wherein the sense enable circuit comprises:

an inverter having an input coupled to the data line and an output coupled to the gate of the first transistor, the inverter operative to be enabled and disabled responsive to the sense amplifier; and a third transistor having a drain coupled to an output of the inverter, a source coupled to a ground node, and a gate that receives the sense amplifier enable signal.

6. A device according to claim 5, wherein the first transistor comprises an NMOS transistor having a source coupled to the data line, and wherein the second transistor comprises a PMOS transistor having a drain coupled to a drain of the NMOS transistor and a source coupled to the power supply node.

7. A device according to claim 1:

wherein the data line is coupled to an input of the buffer;

wherein the output buffer comprises an inverter operative to be enabled and disabled responsive to the sense amplifier enable signal; and wherein the sense amplifier circuit comprises a transistor coupled between the data line and the power supply node and having a gate that receives the sense amplifier enable signal.

8. A device according to claim 1, wherein the cell select circuitry is configured to selectively couple the memory cells to a plurality of bit lines responsive to signals on word lines, and wherein the cell select circuitry includes a gate circuit that selectively couples the bit lines to the data line responsive to a plurality of column select signals.

9. A memory device comprising:

a memory cell array with a plurality of memory cells connected to a plurality of word lines and operative to be selectively connnected to a plurality of bit lines responsive to signals on the word lines;

a pre-discharge circuit that predischarges the plurality of bit lines during a pre-discharge operation;

a data input and output gate circuit that transmits data between the plurality of bit lines and a plurality of data lines during a read operation; and a sense amplifier including a bias circuit that biases the data lines to a bias voltage level in response to a bias control signal during the read operation, and an amplifier circuit that detects and amplifies voltage changes on the plurality of data lines and that responsively generates a sense output signal subject to a sense amplifier enable signal during the read operation.

10. A device according to claim 9, wherein the bias circuit comprises:

a first transistor connected between a power supply voltage and the data line;

a second transistor being turned on in response to the bias control signal for turning off the first transistor during the pre-discharge operation, and being turned on when the sense amplifier enable signal is enabled during the read operation; and a first buffer being enabled in response to the bias control signal for buffering a voltage signal of the data line during the read operation, and being disabled when the sense amplifier enable signal is enabled during the read operation.

11. A device according to claim 10, wherein the first and second transistors comprise respective PMOS transistors.

12. A device according to claim 10, wherein the first buffer generates a signal with a power supply voltage when a voltage of the data line is greater than the bias voltage, and generates the signal with a ground voltage when the voltage of the data line is lower than the bias voltage.

13. A device according to claim 9, wherein the sense amplifier circuit comprises:

a third transistor that is connected between a power supply voltage and a first node and that supplies a current to the first node;

an inverter operative to be enabled in response to the sense amplifier enable signal and that inverts a voltage level of the data line and transmits the inverted voltage level to a second node;

a fourth transistor connected between the second node and a ground voltage and operative to be turned off in response to the sense amplifier enable signal during the read operation;

a fifth transistor connected between the first node and the data line and operative to be turned on in response to a voltage signal of the second node to let a current flow from the first node to the data line; and a second buffer operative to be enabled in response to the sense amplifier enable signal and to buffer a signal of the first node and responsively generate the sense output signal.

14. A device according to claim 13, wherein a transconductance of the fifth transistor is greater than a transconductance of the third transistor.

15. A device according to claim 13, wherein the third transistor is a PMOS transistor.

16. A device according to claim 13, wherein the fifth and fourth transistors comprise respective NMOS transistors.

17. A device according to claim 13, wherein the inverter generates a signal with a ground voltage when a voltage of the data line is greater than the bias voltage, and generates the signal with a power supply voltage when a voltage of the data line is lower than the bias voltage.

18. A device according to claim 9, wherein the sense amplifier circuit comprises:
   a third transistor that is connected between a power supply voltage and a first node and that supplies a current to the first node;
   a fourth transistor that is connected between the first node and the data line and that supplies a current to the data line by being turned on in response to the sense amplifier enable signal; and
   a second buffer operative to be enabled in response to the sense amplifier enable signal and to buffer a voltage signal of the data line to generate the sense output signal.

19. A device according to claim 18, wherein the third and fourth transistors comprise respective PMOS transistors.

20. A device according to claim 18, wherein the second buffer generates the sense output signal with a ground voltage when a voltage level of the data line is lower than that of the bias voltage, and generates the sense output signal with a power supply voltage when a voltage level of the data line is higher than that of the bias voltage.

21. A sense amplifier comprising:
   a bias circuit that biases a sense input signal terminal to a bias voltage level in response to a bias control signal; and
   a sense amplifier circuit that generates a sense output signal by detecting and amplifying a change of the bias voltage level of the sense input signal terminal in response to a sense amplifier enable signal, wherein the bias circuit comprises:
      a first transistor connected between a power supply voltage and the sense input signal terminal;
      a second transistor that turns off the first transistor by being turned on in response to the bias control signal and by being turned on when the sense amplifier enable signal is enabled; and
      a first buffer operative to be enabled in response to the bias control signal and to buffer a voltage of the sense input signal terminal, and to be disabled when the sense amplifier enable signal is enabled.

22. A sense amplifier according to claim 21, wherein the first and second transistors comprise respective PMOS transistors.

23. A sense amplifier according to claim 22, wherein the first buffer generates a signal with a power supply voltage if a voltage of the sense input signal terminal is greater than the bias voltage and generates the signal with a ground voltage if a voltage of the sense input signal terminal is less than the bias voltage.

24. A sense amplifier according to claim 21, wherein the sense amplifier circuit comprises:
   a third transistor that is connected between a power supply voltage and a first node and that supplies a current to the first node;
   an inverter operative to be enabled in response to the sense amplifier enable signal and to invert a voltage level of the data line and to transmit the inverted voltage level to a second node;
   a fourth transistor connected between the second node and a ground voltage and operative to be turned off in response to the sense amplifier enable signal;
   a fifth transistor connected between the first node and the sense input signal terminal and operative to be turned on in response to a signal of the second node to let a current flow from the first node to the sense input signal terminal; and
   a second buffer operative to be enabled in response to the sense amplifier enable signal and to buffer a signal of the first node to generate the sense output signal.

25. A sense amplifier according to claim 24, wherein a transconductance of the fifth transistor is greater than a transconductance of the third transistor.

26. A sense amplifier according to claim 25, wherein the third transistor is a PMOS transistor.

27. A sense amplifier according to claim 24, wherein the fifth and fourth transistors comprise respective NMOS transistors.

28. A sense amplifier according to claim 24, wherein the inverter generates a signal with a ground voltage when a voltage of the sense input signal terminal is greater than the bias voltage, and generates the signal with a power supply voltage when a voltage of the sense input signal terminal is lower than the bias voltage.

29. A sense amplifier according to claim 21, wherein the sense amplifier circuit comprises:
   a third transistor that is connected between a power supply voltage and a first node and that supplies a current to the first node;
   a fourth transistor that is connected between the first node and the sense input signal terminal and that supplies a current to the sense input signal terminal line by being turned on in response to the sense amplifier enable signal; and
   a second buffer operative to be enabled in response to the sense amplifier enable signal and to buffer a voltage signal of the sense input signal terminal to generate the sense output signal.

30. A sense amplifier according to claim 29, wherein the third and fourth transistors comprise respective PMOS transistors.

31. A sense amplifier according to claim 29, wherein the second buffer generates the sense output signal with a ground voltage when a voltage level of the sense input signal terminal is lower than that of the bias voltage, and generates the sense output signal with a power supply voltage when a voltage level of the sense input signal terminal is higher than that of the bias voltage.

* * * * *

UNITED STATES PATENT AND TRADEMARK OFFICE
CERTIFICATE OF CORRECTION

| | |
|---|---|
| PATENT NO. | : 6,906,974 B2 |
| DATED | : June 14, 2005 |
| INVENTOR(S) | : Seong-Ho Jeung |

It is certified that error appears in the above-identified patent and that said Letters Patent is hereby corrected as shown below:

Column 11,
Line 57, please change "claim 22" to -- claim 21 --.

Signed and Sealed this

Ninth Day of August, 2005

JON W. DUDAS
*Director of the United States Patent and Trademark Office*